(12) United States Patent
Saga

(10) Patent No.: US 6,267,158 B1
(45) Date of Patent: Jul. 31, 2001

(54) SEALED CONTAINER, STORAGE APPARATUS, ELECTRONIC PART CONVEYANCE SYSTEM, AND METHOD OF STORAGE AND CONVEYANCE OF ELECTRONIC PARTS

(75) Inventor: Koichiro Saga, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/590,074

(22) Filed: Jun. 9, 2000

(30) Foreign Application Priority Data

Jun. 11, 1999 (JP) .................................................. 11-165447

(51) Int. Cl.[7] ....................................................... B65B 1/04
(52) U.S. Cl. .................................. 141/94; 141/98; 141/65
(58) Field of Search ........................................ 141/94, 98, 1, 141/63, 64, 65; 414/217, 331, 939, 940

(56) References Cited

U.S. PATENT DOCUMENTS

| | | | |
|---|---|---|---|
| 5,586,585 | * 12/1996 | Bonora et al. | ............................ 141/93 |
| 6,042,651 | * 3/2000 | Roberson, Jr. et al. | ............... 141/98 |
| 6,135,168 | * 10/2000 | Yang et al. | ............................ 141/98 |

* cited by examiner

*Primary Examiner*—Steven O. Douglas
(74) *Attorney, Agent, or Firm*—Ronald P. Kananen; Rader, Fishman & Grauer

(57) ABSTRACT

To provide a sealed container, a storage apparatus, an electronic part conveyance system and methods of storage and conveyance of an electronic part able to inhibit growth of a native oxide film on the electronic part without an excessive supply of an inert gas.

A sealed container storing an electronic part inside it and maintaining the inside at an inert gas atmosphere, including an oxygen concentration meter, a moisture concentration meter, a clock means for measuring an elapsed time from when storing the electronic part in the inside, a means for calculating integrals of concentration of oxygen and concentration of moisture with respect to time, a judging means for comparing the integrals with predetermined reference values (thresholds) set in advance and judging their magnitudes compared with the thresholds, and an alarm means for warning that at least one of the integral of the concentration of oxygen and the integral of the concentration of moisture has exceeded the threshold, and methods of storage and conveyance of an electronic part using the same.

35 Claims, 5 Drawing Sheets

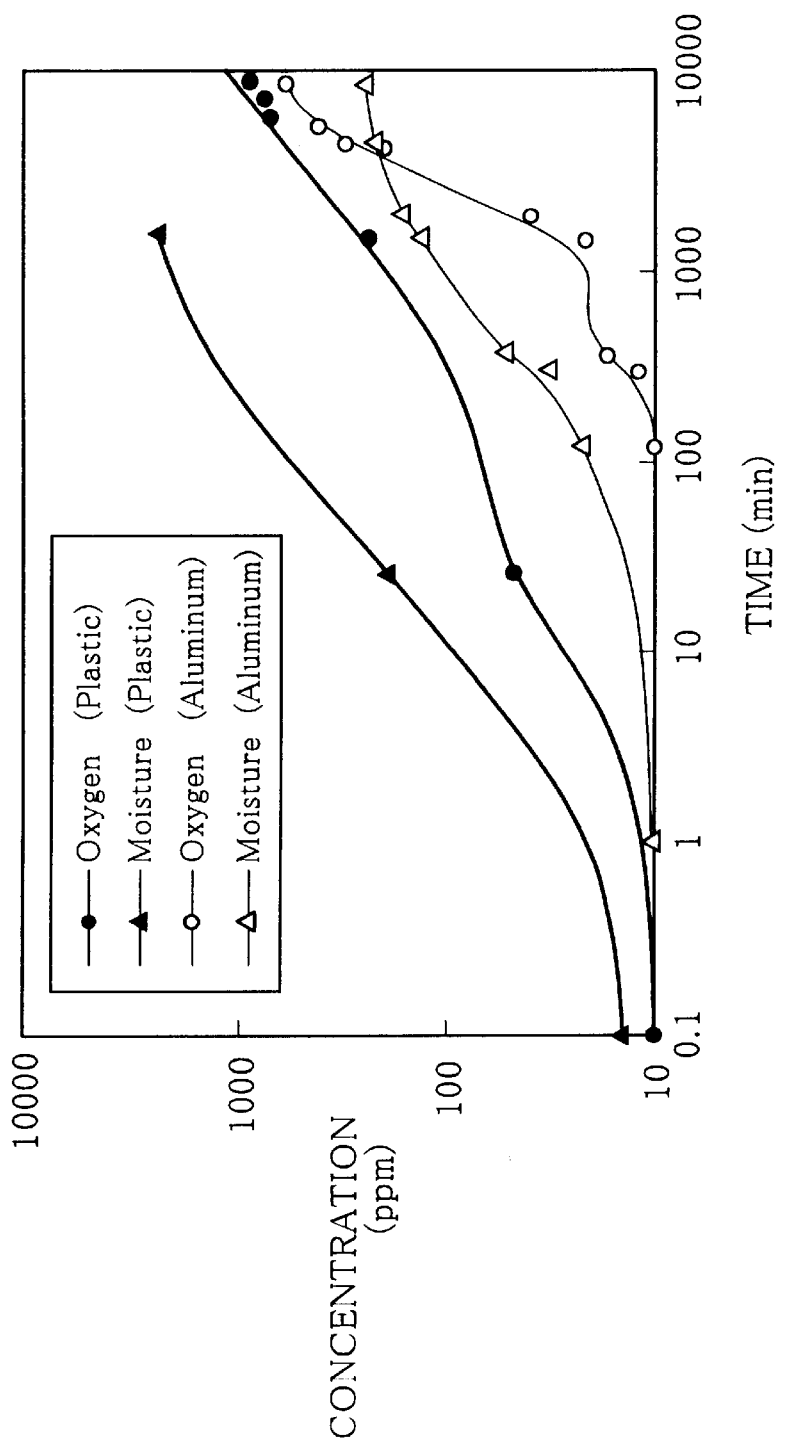

SEALED CONTAINER, STORAGE APPARATUS, ELECTRONIC PART CONVEYANCE SYSTEM, AND METHOD OF STORAGE AND CONVEYANCE OF ELECTRONIC PARTS

BACKGROUND OF THE INVENTION

1. Field of the Invention

The present invention relates to a sealed container, a storage apparatus, an electronic part conveyance system for storage or conveyance of an electronic part and a method of storage and conveyance of an electronic part in a process of production of a semiconductor device, a liquid crystal display device, a magnetic disk, etc., more particularly relates to a sealed container, a storage apparatus, and an electronic part conveyance system and a method of storage and conveyance of an electronic part able to inhibit formation of a native oxide film on the surface of a silicon wafer.

2. Description of the Related Art

In the process of production of a semiconductor device, the wafer is washed and dried before treatment such as oxidation and film formation. Also, when moving a wafer to a different treatment system or when storing a wafer temporarily between production steps, the wafer is usually exposed to the atmosphere in a clean room. Under the above situation, a thin native oxide film of as much as several nm grows on the surface of the wafer.

As factors affecting the growth rate of the native oxide film, the concentration of oxygen, concentration of moisture, temperature, and, in addition, the composition and surface conditions of the wafer can be mentioned.

Along with the miniaturization and higher integration of semiconductor devices, the effect of the thin native oxide film on the characteristics of semiconductor devices has increased and even a native oxide film having a thickness of about 0.5 nm is now being considered a problem. Especially, when forming a refractory metal silicide on a polysilicon electrode or when forming a silicide on the surface of source/drain regions and other impurity diffusion layers (SALICIDE; self-aligned silicide process), any native oxide film present becomes an obstacle to forming a uniform silicide. Also, if a native oxide film having a thickness of more than 0.5 nm is present, it influences the dielectric breakdown voltage of a gate oxide film.

Devices for performing a washing treatment on the wafer in a nitrogen gas atmosphere to inhibit growth of such a native oxide film or deposition of organic material etc. are for example described in Japanese Unexamined Patent Publication (Kokai) No. 3-242932, Japanese Unexamined Patent Publication (Kokai) No. 4-124825, Japanese Unexamined Patent Publication (Kokai) No. 5-160095, and Japanese Unexamined Patent Publication (Kokai) No. 6-181191.

However, according to these prior arts, although the washing process is performed in a nitrogen gas atmosphere and the growth of the native oxide film is inhibited, after the washing, the wafer is exposed to the atmosphere and then stored in a carrier box. After this, the inside of the carrier box is purged with nitrogen gas and the wafer is moved to the equipment of the next process under conditions where the growth of the native oxide film is inhibited. Therefore, there has been a problem that the native oxide film grows when the wafer is moved between the treatment equipment and the carrier box.

Therefore, several apparatuses for inhibiting the growth of a native oxide film on a wafer by performing all the conveyance between treatment devices in a nitrogen gas atmosphere have been proposed. For example, Japanese Unexamined Patent Publication (Kokai) No. 5-82622 discloses a mechanical interface, comprising a body casing of a wafer treatment device for storing the wafer treatment device and filled with clean air and a carrier box (pod) able to engage with the body casing air-tightly, enabling the inside of the pod to be filled with high purity nitrogen gas each time a pod is set at the body casing.

Also, Japanese Unexamined Patent Publication (Kokai) No. 10-64861 discloses a wafer washing apparatus enabling all of the conveyance from a washing treatment to a treatment device of the next step to be performed in an inert gas, preferably, in a nitrogen gas atmosphere, and a method of washing a wafer using this apparatus. This method of washing first attaches a carrier box of a wafer to a treatment box containing a wafer washing unit and seals the inside of the treatment box and the carrier box air-tightly by the casings of the two boxes. In the air-tight state, a bottom plate of the carrier box is moved in the treatment box using an elevator in the treatment box. Due to this, the wafer is loaded in the treatment box in a nitrogen atmosphere. The wafer is unloaded by the reverse procedure.

According to this washing method or apparatus, the wafer is no longer exposed to the atmosphere after the wafer is washed and until conveyed to the apparatus of the next production step, so the growth of a native oxide film due to the oxygen and moisture in the atmosphere can be inhibited.

Further, Japanese Unexamined Patent Publication (Kokai) No. 10-321714 discloses a conveyable sealed container, for a wafer used during the process of production of a wafer, which is able to completely replace the gas inside the container in an extremely short time and an atmosphere replacement device for a sealed container and a method of replacing an atmosphere. This conveyable sealed container has a plurality of vent holes along facing inner sides of the casing. When nitrogen is supplied, a laminar flow of nitrogen is formed in the container. Therefore, the gas to be replaced is efficiently exhausted and the gas being supplied (nitrogen) fills the container in an extremely short time.

According to the apparatuses or the methods described in the above Japanese Unexamined Patent Publication (Kokai) No. 5-82622, Japanese Unexamined Patent Publication (Kokai) No. 10-64861, and Japanese Unexamined Patent Publication (Kokai) No. 10-321714, it is possible to inhibit the growth of the native oxide film on a wafer when moving, conveying, or temporarily storing the wafer in the process of production of the wafer.

However, according to the above conventional apparatuses or methods, it is difficult to make completely air-tight the joinder between the part accommodating the wafer treatment device (for example, the above described body casing or treatment box) and the conveyable container (for example, the above described carrier box or container).

For improving the air-tightness of the joinder, the material of the joinder, comprised of metal, plastic, etc., is mechanically polished or otherwise treated or the joinder is achieved by vacuum adhesion or mechanical clamping via an O-ring or other packing.

Even by these methods, the center line mean roughness of the surface at the joinder is for example about several 10 $\mu$m. It is difficult to eliminate the roughness of the surface microscopically. Therefore, a slight leak occurs. Also, when these apparatuses are used, since vacuum exhaust and gas replacement are repeated, if fine particles detach from the surface of the joinder due to the change of the inside pressure or an effect of the gas flow, the air-tightness of the join will decline further.

Therefore, even if the container in which the wafer is held is filled with for example high purity nitrogen as an inert gas to decrease the concentration of oxygen and concentration of moisture in the container, the concentration of oxygen and the concentration of moisture will increase along with the elapse of time.

FIG. 5 shows an example of the change of the concentration of oxygen and the concentration of moisture in a sealed container along with the elapse of time. As shown in FIG. 5, if the container is sealed and held after the concentration of oxygen and the concentration of moisture are made about 10 ppm, both when that the joinder part is plastic and is aluminum, the concentrations of oxygen and moisture remarkably increase after the elapse of about one week. As described above, even if a wafer is stored in a sealed container in the state where the concentrations of oxygen and moisture are lowered, the conditions are present for easier growth of a native oxide film along with time.

To prevent this, there is the method of continuously passing a large amount of high purity nitrogen, but the cost of the gas becomes a problem. If a gas such as argon is used as an inert gas, the cost becomes even higher.

If the flow rate of the inert gas is lowered to suppress the cost of the inert gas, the native oxide film grows and the yields of semiconductor devices, liquid crystal display devices, magnetic disks, etc. produced by using the wafers decrease.

Up to now, the above various apparatuses and methods have been proposed for conveying or treating a wafer in a nitrogen atmosphere, but the conditions enabling inhibition of the growth of a native oxide film over a certain period have not been clarified. Also, the conditions for keeping the inside of a sealed container as an inert gas atmosphere without supplying an excess inert gas but with supplying an appropriate amount of an inert gas corresponding to the change of the gas composition in the sealed container along with time have not been clarified.

Due to these things, the already proposed various apparatuses have been slow to be commercially applied at the production level at the present.

SUMMARY OF THE INVENTION

An object of the present invention is to provide a sealed container containing a semiconductor wafer and/or other electronic part, preventing growth of a native oxide film thereon.

Another object of the present invention is to provide a storage apparatus storing an electronic part with an inert gas atmosphere maintained.

Still another object of the present invention is to provide an electronic part conveyance system enabling to move an electronic part treated in a treatment device into a sealed container with an inert gas atmosphere maintained.

Yet still another object of the present invention is to provide a method of storage and conveyance of an electronic part preventing growth of a native oxide film thereon.

To achieve the above object, the sealed container of the present invention is a sealed container for storing an electronic part in an inert gas atmosphere, characterized by comprising an oxygen concentration meter for measuring a concentration of oxygen in a sealed space filled with the inert gas; a moisture concentration meter for measuring a concentration of moisture in the sealed space; a time counting means for counting an elapsed time from when storing the electronic part in the sealed space; a judging means for comparing the elapsed time with a predetermined reference time and judging its magnitude with the reference time; and an alarm means for warning that the elapsed time has exceeded the reference time.

The sealed container of the present invention is preferably characterized in that the reference time is a time until a predetermined thickness of a native oxide film affecting a characteristic of the electronic part is formed on the surface of the electronic part.

Further, to achieve the above object, the sealed container of the present invention is a sealed container for storing electronic parts in an inert gas atmosphere, characterized by comprising an oxygen concentration meter for measuring a concentration of oxygen in a sealed space filled with the inert gas; a moisture concentration meter for measuring a concentration of moisture in the sealed space; a time counting means for counting an elapsed time from when storing the electronic part in the sealed space; a calculating means for calculating an integral of the concentration of oxygen obtained by integrating the concentration of oxygen with respect to the elapsed time and an integral of the concentration of moisture obtained by integrating the concentration of moisture with respect to the elapsed time; a first judging means for comparing the integral of the concentration of oxygen with a predetermined oxygen reference value and judging its magnitude compared with the oxygen reference value; a second judging means for comparing the integral of the concentration of moisture with a predetermined moisture reference value and judging its magnitude compared with the moisture reference value; and an alarm means for warning that at least one of the integral of the concentration of oxygen and the integral of the concentration of moisture has exceeded a reference value.

The sealed container of the present invention is preferably characterized in that the reference value is an integral of the concentration of oxygen with respect to time or an integral of the concentration of moisture with respect to time until a predetermined thickness of a native oxide film affecting a characteristic of the electronic part is formed on the surface of the electronic part.

The sealed container of the present invention is preferably characterized in that the inert gas atmosphere is a nitrogen gas atmosphere. The sealed container of the present invention is preferably characterized in that the electronic part comprises a silicon substrate. The sealed container of the present invention is characterized in that the predetermined thickness is about 0.3 nm.

Due to this, when conveying an electronic part between treatment devices in the process of production of a semiconductor device etc., it is possible to keep an inside of the sealed container an inert gas atmosphere in which a native oxide film does not grow on a surface of a wafer or other electronic part. Therefore, an excessive supply of the inert gas is unnecessary and the production cost can be decreased. Also, when storing or conveying an electronic part using the sealed container of the present invention, since the growth of the native oxide film on the electronic part is inhibited, the yield of the semiconductor devices and other products using the electronic part can be improved.

To achieve the above object, the storage apparatus of the present invention is a storage apparatus for storing at least one electronic part in a storage unit with an inert gas atmosphere, characterized by comprising an atmosphere replacement device for replacing the gas in the storage unit with the inert gas; an oxygen concentration meter for measuring a concentration of oxygen in the storage unit filled with the inert gas; a moisture concentration meter for measuring a concentration of moisture in the storage unit; a time counting means for counting an elapsed time from when storing the electronic part in the storage unit; a calculating means for calculating an integral of the concentration of oxygen obtained by integrating the concentration of oxygen with respect to the elapsed time and an integral of the concentration of moisture obtained by integrating the concentration of moisture with respect to the elapsed time; a first judging means for comparing the integral of the concentration of oxygen with a predetermined oxygen reference value and judging its magnitude compared with the oxygen reference value; a second judging means for comparing the integral of the concentration of moisture with a predetermined moisture reference value and judging its magnitude compared with the moisture reference value; and an alarm means for warning that at least one of the integral of the concentration of oxygen and the integral of the concentration of moisture has exceeded a reference value.

The storage apparatus of the present invention is preferably characterized in that the reference value is an integral of the concentration of oxygen with respect to time or an integral of the concentration of moisture with respect to time until a predetermined thickness of a native oxide film affecting a characteristic of the electronic part is formed on the surface of the electronic part.

The storage apparatus of the present invention is preferably characterized in that the inert gas atmosphere is a nitrogen gas. The storage apparatus of the present invention is preferably characterized in that the electronic part comprises a silicon substrate. The storage apparatus of the present invention is preferably characterized in that the predetermined thickness is about 0.3 nm.

Due to this, when storing a wafer or other electronic part, it is possible to keep the inside of the storage apparatus (storage unit) an inert gas atmosphere in which a native oxide film does not grow on the surface of the electronic part. According to the storage apparatus of the present invention, it is possible to supply the inert gas continuously in the storage apparatus while suitably controlling the amount of supply of the inert gas. Therefore, it is not necessary to supply the inert gas in excess and the cost of the inert gas is decreased.

Also, if storing an electronic part using the storage apparatus of the present invention, since the growth of the native oxide film on the electronic part is inhibited, the yield of the semiconductor devices and other products using the electronic part can be improved.

To achieve the above object, the electronic part conveyance system of the present invention is an electronic part conveyance system characterized by comprising a sealed container for storing and conveying an electronic part in an inert gas atmosphere, comprising an opening for loading and unloading of the electronic part and a cover for covering the opening and holding the electronic part; a treatment device attachable with and detachable from the sealed container, tightly contacting the cover and the periphery of the opening of the sealed container, and treating the electronic part in the inside filled with the inert gas; a support connected with the cover; a support moving means built in the treatment device for moving the support, the cover, and the electronic part in the treatment device: a gas replacement device for supplying an inert gas into a shared sealed space formed in the sealed container and the treatment device in a state with the support, the cover and the electronic part moved inside the treatment device; said device replacing the gas in the shared sealed space; an oxygen concentration meter for measuring a concentration of oxygen in the shared sealed space filled with the inert gas; a moisture concentration meter for measuring a concentration of moisture in the shared sealed space; a time counting means for counting an elapsed time from when treatment of the electronic part in the treatment device is finished; a calculating means for calculating an integral of the concentration of oxygen obtained by integrating the concentration of oxygen with respect to the elapsed time and an integral of the concentration of moisture obtained by integrating the concentration of moisture with respect to the elapsed time; a first judging means for comparing the integral of the concentration of oxygen with a predetermined oxygen reference value and judging its magnitude compared with the oxygen reference value; a second judging means for comparing the integral of the concentration of moisture with a predetermined moisture reference value and judging its magnitude compared with the moisture reference value; and an alarm means for warning that at least one of the integral of the concentration of oxygen and the integral of the concentration of moisture has exceeded a reference value.

The electronic part conveyance system of the present invention is preferably characterized in that the reference value is an integral of the concentration of oxygen with respect to time or an integral of the concentration of moisture with respect to time until a predetermined thickness of a native oxide film affecting a characteristic of the electronic part is formed on the surface of the electronic part.

The electronic part conveyance system of the present invention is preferably characterized in that the treatment comprises a washing treatment and the treatment device comprises a washing device.

The electronic part conveyance system of the present invention is preferably characterized in that the inert gas atmosphere is a nitrogen gas atmosphere. The electronic part conveyance system of the present invention is preferably characterized in that the electronic part comprises a silicon substrate. The electronic part conveyance system of the present invention is preferably characterized in that the predetermined thickness is about 0.3 nm.

Due to this, it becomes possible to move an electronic part treated in a washing device or other treatment device into the conveyable sealed container with the inert gas atmosphere maintained. After the inside of the sealed container connected to the treatment device is made an inert gas atmosphere, by attaching the cover in the sealed container and separating the sealed container from the treatment device, the electronic part is accommodated in the sealed container and can be conveyed.

To achieve the above object, the method of storage of an electronic part of the present invention is a method of storage of an electronic part characterized by comprising the steps of: storing the electronic part in a sealed container filled with an inert gas; measuring a concentration of oxygen and a concentration of moisture in the sealed container; counting an elapsed time from when storing the electronic part in the sealed container; calculating an integral of the concentration of oxygen obtained by integrating the concentration of oxygen with respect to the elapsed time and an integral of the concentration of moisture obtained by integrating the concentration of moisture with respect to the elapsed time; comparing the integral of the concentration of oxygen with a predetermined oxygen reference value and judging its magnitude compared with the oxygen reference value; comparing the integral of the concentration of moisture with a predetermined moisture reference value and judging its magnitude compared with the moisture reference value; and warning that at least one of the integral of the concentration of oxygen and the integral of the concentration of moisture has exceeded a reference value.

The method of storage of an electronic part of the present invention is preferably characterized by comprising the step of determining that the electronic part is unable to be used if the integral of the concentration of oxygen has exceeded the oxygen reference value and/or if the integral of the concentration of moisture has exceeded the moisture reference value.

The method of storage of an electronic part of the present invention is preferably characterized by further comprising the step of conducting a test in advance to find the integral of the concentration of oxygen with respect to time and the integral of the concentration of moisture with respect to time until a predetermined thickness of a native oxide film affecting a characteristic of the electronic part is formed on the surface of the electronic part and using the integrals as the reference values.

The method of storage of an electronic part of the present invention is preferably characterized in that the test is conducted under the condition of supply of an inert gas and the concentration of oxygen and the concentration of moisture being kept constant.

The method of storage of an electronic part of the present invention is preferably characterized in that the inert gas is a nitrogen gas. The method of storage of an electronic part of the present invention is preferably characterized in that the electronic part comprises a silicon substrate.

The method of storage of an electronic part of the present invention is preferably characterized in that the inert gas is a nitrogen gas; the electronic part comprises a silicon substrate; the oxygen reference value is an integral of the concentration of oxygen of about 10 ppm with respect to at least one week; the moisture reference value is an integral of the concentration of moisture of about $10^4$ ppm with respect to at least one week; and the predetermined thickness is about 0.3 nm.

Alternatively, the method of storage of an electronic part of the present invention is preferably characterized in that the inert gas is a nitrogen gas; the electronic part comprises a silicon substrate; the oxygen reference value is an integral of the concentration of oxygen of about $2.1 \times 10^5$ ppm with respect to at least one week; the moisture reference value is an integral of the concentration of moisture of about 10 ppm with respect to at least one week; and the predetermined thickness is about 0.3 nm.

Alternatively, the method of storage of an electronic part of the present invention is preferably characterized in that the inert gas is a nitrogen gas; the electronic part comprises a silicon substrate; the oxygen reference value is an integral of the concentration of oxygen of about $10^2$ ppm with respect to at least one week; the moisture reference value is an integral of the concentration of moisture of about $10^2$ ppm with respect to at least one week; and the predetermined thickness is about 0.3 nm.

Due to this, when conveying an electronic part between treatment devices in the process of production of semiconductor devices etc., it is possible to inhibit the growth of a native oxide film on a surface of a wafer or other electronic part. Also, if a carrier container is sealed for a certain period with an atmosphere where the native oxide film does not grow, it is not necessary to supply the inert gas in excess and the production cost can be decreased. Also, since the growth of the native oxide film on the electronic part is inhibited, the yield of semiconductor devices and other products can be improved.

Further, to achieve the above object, the method of storage of an electronic part of the present invention is a method of storage of an electronic part characterized by comprising the steps of: storing at least one electronic part in a storage apparatus filled with an inert gas; supplying the inert gas in the storage apparatus; measuring a concentration of oxygen and a concentration of moisture in the storage apparatus; counting an elapsed time from when storing the electronic part in the storage apparatus; calculating an integral of the concentration of oxygen obtained by integrating the concentration of oxygen with respect to the elapsed time and an integral of the concentration of moisture obtained by integrating the concentration of moisture with respect to the elapsed time; comparing the integral of the concentration of oxygen with a predetermined oxygen reference value and judging its magnitude compared with the oxygen reference value; comparing the integral of the concentration of moisture with a predetermined moisture reference value and judging its magnitude compared with the moisture reference value; and warning that at least one of the integral of the concentration of oxygen and the integral of the concentration of moisture has exceeded a reference value.

The method of storage of an electronic part of the present invention is preferably characterized by further comprising the step of determining that the electronic part is unable to be used if the integral of the concentration of oxygen has exceeded the oxygen reference value and/or if the integral of the concentration of moisture has exceeded the moisture reference value.

The method of storage of an electronic part of the present invention is preferably characterized by further comprising the step of conducting a test in advance to find the integral of the concentration of oxygen with respect to time and the integral of the concentration of moisture with respect to time until a predetermined thickness of a native oxide film affecting a characteristic of the electronic part is formed on the surface of the electronic part and using the integrals as the reference values.

Due to this, when storing an electronic part of semiconductor devices etc., it is possible to inhibit growth of a native oxide film on a surface of a wafer or other electronic part. Also, if the amount of supply (flow rate) of an inert gas is lowered within a range able to inhibit growth of the native oxide film for a certain time after the inside of the storage apparatus is replaced with the inert gas atmosphere, an excess supply of the inert gas is prevented. Therefore, the production cost can be decreased. Also, since the growth of the native oxide film on the electronic part is inhibited, the yield of semiconductor devices and other products using the electronic part can be improved.

To achieve the above object, the method of conveyance of an electronic part of the present invention is a method of an electronic part for moving an electronic part between a sealed container and a treatment device; said sealed container comprising an opening for loading and unloading of the electronic part and a cover for covering the opening and holding the electronic part and storing and conveying the electronic part in an inert gas atmosphere, and said treatment device attachable with and detachable from the sealed container and treating the electronic part in the inside filled with the inert gas; said method characterized by comprising the steps of: bringing the cover and the periphery of the opening of the sealed container into tight contact with a support of a surface of the treatment device; making the support, the cover, and the electronic part move in the treatment device to form a shared sealed space in the sealed container and the treatment device; treating the electronic part; supplying the inert gas in the shared sealed space; measuring a concentration of oxygen and a concentration of moisture in the sealed container; counting an elapsed time from when the treatment is finished; calculating an integral of the concentration of oxygen obtained by integrating the concentration of oxygen with respect to the elapsed time and an integral of the concentration of moisture obtained by integrating the concentration of moisture with respect to the elapsed time; comparing the integral of the concentration of oxygen with a predetermined oxygen reference value and judging its magnitude compared with the oxygen reference value; comparing the integral of the concentration of moisture with a predetermined moisture reference value and judging its magnitude compared with the moisture reference value; warning that at least one of the integral of the concentration of oxygen and the integral of the concentration of moisture has exceeded a reference value; and, before any such warning, making the support move until the cover covers the opening and thereby storing the electronic part in the sealed container.

The method of conveyance of an electronic part of the present invention is preferably characterized by further comprising the step of conducting a test in advance to find the integral of the concentration of oxygen with respect to time and the integral of the concentration of moisture with respect to time until a predetermined thickness of a native oxide film affecting a characteristic of the electronic part is formed on a surface of the electronic part and using the integrals as reference values.

The method of conveyance of an electronic part of the present invention is preferably characterized in that the treatment comprises a washing treatment and the treatment device comprises a washing device.

The method of conveyance of an electronic part of the present invention is preferably characterized in that the inert gas atmosphere is a nitrogen gas atmosphere. The method of conveyance of an electronic part of the present invention is preferably characterized in that the electronic part comprises a silicon substrate.

Due to this, it becomes possible to move an electronic part treated in a washing device or other treatment device into the conveyable sealed container with the inert gas atmosphere maintained. After the inside of the sealed container connected to the treatment device is made an inert gas atmosphere, by attaching the cover in the sealed container and separating the sealed container from the treatment device, the electronic part is accommodated in the sealed container. Also, since it is possible to finish the above operation before a native oxide film grows on the surface of the electronic part, the yield of products using the electronic part can be improved.

BRIEF DESCRIPTION OF THE DRAWINGS

These and other objects and features of the present invention will become clearer from the following description of the preferred embodiments given with reference to the accompanying drawings, in which:

FIGS. 1A and 1B, is a schematic view of the method of storage and conveyance of an electronic part shown in a first embodiment of the present invention;

FIG. 5 is a figure showing changes of a concentration of oxygen and a concentration of moisture in a sealed container as time elapses.

DESCRIPTION OF THE PREFERRED EMBODIMENTS

Below, embodiments of the sealed container, the storage apparatus, and the electronic part conveyance system and the method of storage and conveyance of an electronic part of the present invention will be explained with reference to the drawings.

(First Embodiment)

Below, the method of conveyance of an electronic part and the sealed container and the electronic part conveyance system used for the method of the present embodiment will be explained with reference to the schematic view in FIG. 1. The present embodiment shows the method of conveyance, and the system used for the method, for storing and conveying a wafer in a conveyable sealed container 1 and moving the wafer into, for example, a washing device or other treatment device 4 while maintaining a nitrogen atmosphere.

Figure 1:
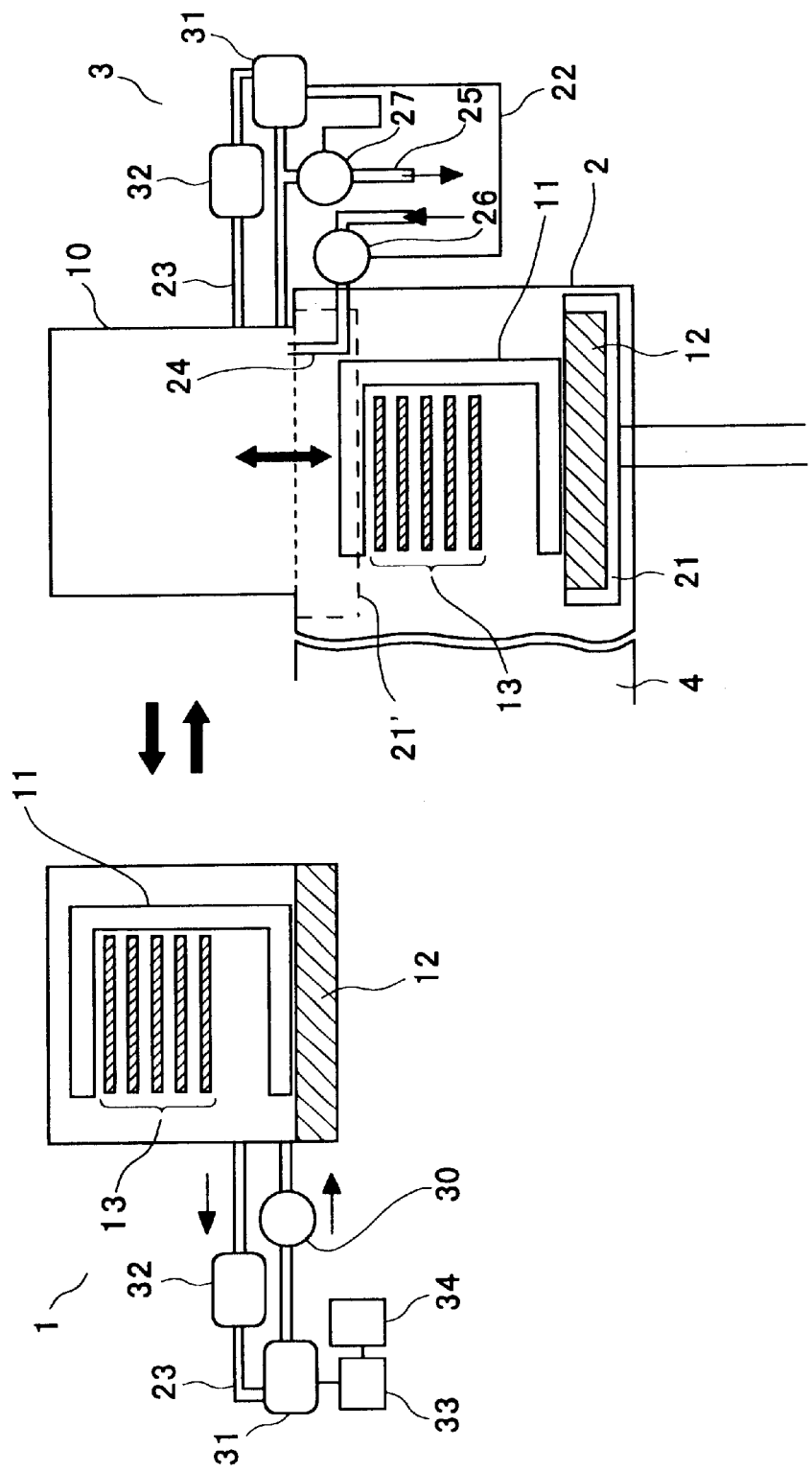
FIG. 1, having

As shown in FIG. 1, the conveying system of the present embodiment contains the conveyable sealed container 1 and a substrate transfer unit 2. The transfer unit is formed with an atmosphere control unit (gas purge unit) 3.

FIG. 1A is a schematic view of the conveyable sealed container 1 in which wafers 13 are stored. The gas in the container 1 is sent to an oxygen concentration meter 31 and a moisture concentration meter 32 by a circulation pump 30 through a concentration measurement pipe 23. Due to this, the concentration of oxygen and the concentration of moisture in the inert gas atmosphere in the container 1 are measured at all times.

As the oxygen concentration meter 31, for example, a zirconia type oxygen concentration meter (Osaka Sanso K.K., OXYMAC series) having a response rate of 10 seconds or better and a sensitivity of 1 ppm or better can be used. As the moisture concentration meter 32, for example, an electrostatic capacity type dew-point hygrometer (Osaka Sanso K.K., DPO-2 type) having a response rate of 10 seconds or better and a sensitivity of 1 ppm or better can be used. It is preferable that both the oxygen concentration meter 31 and the moisture concentration meter 32 be panel mounted types and small and that the volume of the concentration measurement pipe 23 be made small.

Figure 2:
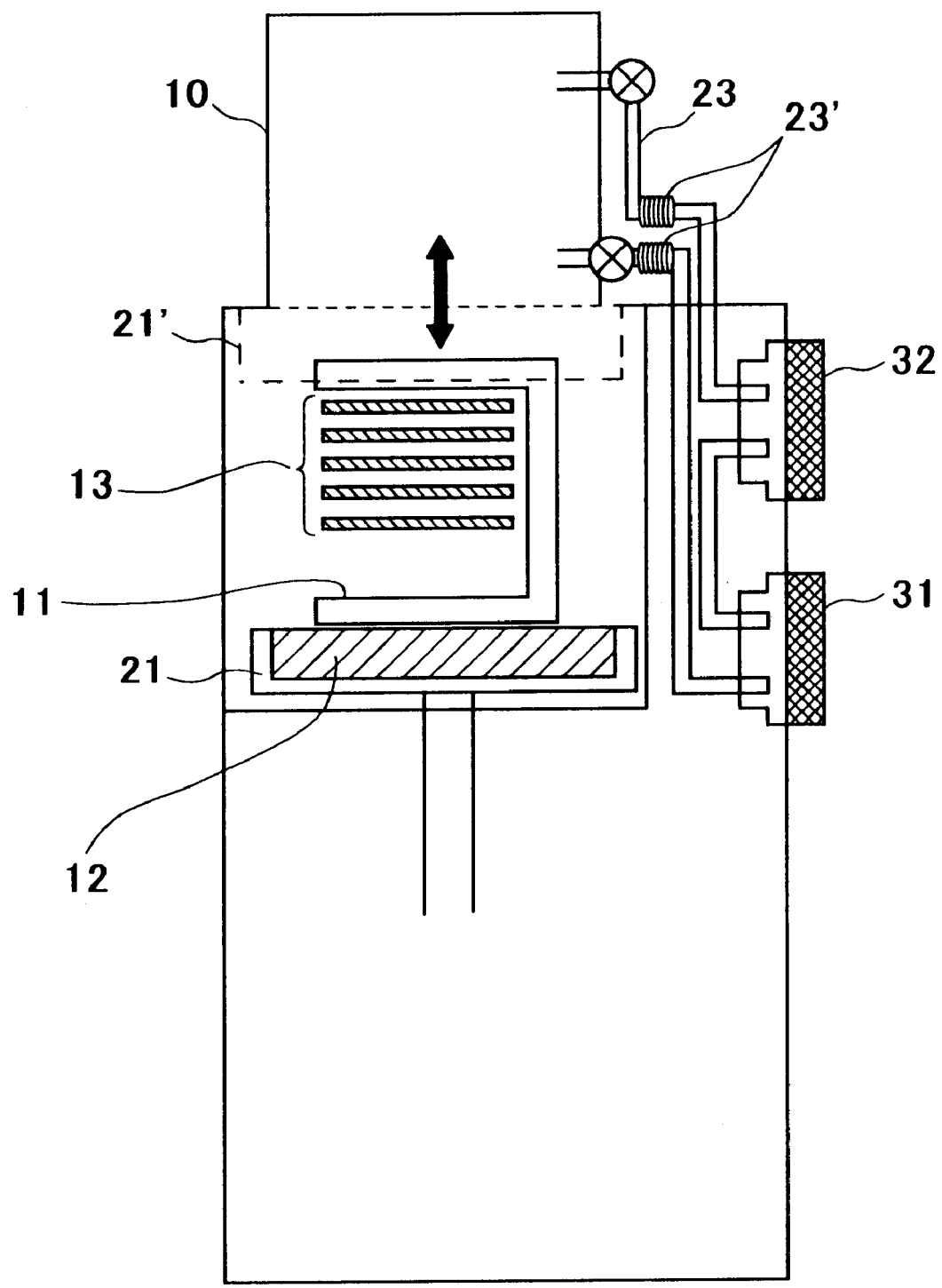
FIG. 2 is a schematic view of the method of storage and conveyance of an electronic part shown in the first embodiment of the present invention.

FIG. 2 shows an example of the apparatus when the panel-mounted type oxygen concentration meter 31 and moisture concentration meter 32 are used. In the apparatus of FIG. 2, the concentration measurement pipe 23 is provided with an expandable pipe adjuster 23' and enables suppression of the volume of the pipe.

Also, as shown in FIG. 1, a clock 33 being as a time counting means is provided in the conveyable sealed container 1. The container 1 is sealed in a state with the concentration of oxygen and the concentration of moisture made less than certain values. The elapsed time after sealing is measured by the clock 33. Also, an integral of the concentration of oxygen with respect to time and an integral of the concentration of moisture with respect to time are calculated at the clock 33.

After sealing the container 1, the atmosphere (gas composition) in the container 1 changes due to the slight leakage and the concentration of oxygen and the concentration of moisture increase along with the elapse of time. The time until a native oxide film grows to a certain problematic thickness (for example 0.3 nm) under conditions of a constant concentration of oxygen and concentration of moisture is examined in advance. The products of the concentrations and the time are regarded as approximate values of the above integrals. These are set as reference values (or thresholds) of the integral of the concentration of oxygen and the integral of the concentration of moisture.

Wafers 13 are stored in the container 1 within the range of the thresholds. The clock 33 is provided with, for example, an alarm device 34, as a means of warning when an integral reaches a threshold.

FIG. 1B is a schematic view of moving wafers 13 in a conveyable sealed container 1 to the washing device 4 using the substrate transfer unit 2. When the conveyable sealed container 1 is not connected to the substrate transfer unit 2, an elevator 21 of the substrate transfer unit 2 is at the position shown as 21'. Due to this, the substrate transfer unit 2 and the washing device 4 are isolated from the outside air and maintained in the same nitrogen atmosphere.

When a bottom cover 12 of the conveyable sealed container 1 is loaded on the elevator 21 of the substrate transfer unit 2, the elevator 21 goes down. During this, the container body 10 is brought into tight contact with the substrate transfer unit 2 and the wafers stored in a cassette 11 on the bottom cover 12 are transferred to the washing device 4 with the nitrogen atmosphere maintained. After washing treatment is performed in the nitrogen atmosphere, the wafers 13 are returned to the cassette 11 and raised by the elevator 21.

Just before the bottom cover 12 is completely returned to the container body 10, that is, when the elevator 21 is just below the position 21', the atmosphere in the conveyable sealed container 1 is controlled using the atmosphere control unit 3. Here, by replacing the atmosphere just before the bottom cover 12 is closed to the container body 10, it is possible to replace the atmosphere in the container 1 efficiently and minimize the volume of nitrogen to be supplied.

The atmosphere control unit 3 comprises at least a nitrogen introduction pipe 24 for supplying nitrogen gas in the container 1, a nitrogen supply valve 26 for controlling the introduction of nitrogen, a nitrogen exhaust pipe 25 connecting to the concentration measurement pipe 23 and exhausting air in the container 1, a nitrogen exhaust valve 27 placed between the concentration measurement pipe 23 and the nitrogen exhaust pipe 25, and a supply and exhaust valve control line 22 for controlling of operation of the nitrogen supply valve 26 and the nitrogen exhaust valve 27 respectively. Also, the nitrogen to be supplied is made as filtered and purified high purity nitrogen.

In the same manner as the sealed container 1, the atmosphere control unit 3 is provided with an alarm device (not shown) or other alarm means to warn when at least one of an integral of concentration of oxygen and an integral of concentration of moisture exceeds a threshold.

The concentration of oxygen and the concentration of moisture are decreased by supplying high purity nitrogen into the container 1. When the atmosphere satisfies a predetermined condition where the growth of the native oxide film is inhibited, the supply of nitrogen is stopped. The supply of nitrogen or the stopping of the supply are controlled by signals via the supply and exhaust valve control line 22. After the supply of nitrogen is stopped, the bottom cover 12 is immediately returned to the container body 10 and the conveyable sealed container 1 is completely sealed. Then the conveyable sealed container 1 is removed from the substrate transfer unit 2. At the same time, measurement by the clock 33 is started. After this, the wafers 13 are transferred to a treatment device of the next manufacturing step before the integral of the concentration of oxygen and the integral of the concentration of moisture reach the predetermined thresholds.

According to the above sealed container, the electronic part conveyance system, and the method of conveyance of an electronic part using them according to the above embodiments, it is possible to move wafers 13 stored in the sealed container 1 into the treatment device with the nitrogen atmosphere maintained and perform for example a washing or other treatment in the treatment device 4. The treated wafers are moved to the sealed container 1 by the reverse process, nitrogen is supplied in the container, then the container 1 is sealed. Due to this, it is possible to inhibit growth of a native oxide film on the surface of the wafer 13.

(Second Embodiment)

Below, the various conditions able to inhibit growth of a native oxide film effectively in the method of conveyance and the sealed container shown as the above first embodiment, that is, the method of determining thresholds of the integral of the concentration of oxygen with respect to time (the integral of the concentration of oxygen) and the integral of the concentration of moisture with respect to time (the integral of the concentration of moisture) in the container 1 will be explained in detail.

The rate of growth of a native oxide film is influenced by the concentration of oxygen and the concentration of moisture in the environment to which a silicon wafer is exposed and the time of exposure of the surface of the silicon wafer to the environment. Also, the rate of growth of a native oxide film changes depending on the surface conditions of the wafer. For example, it is known that the growth of a native oxide film is extremely accelerated on the surface of silicon with a high concentration of impurities and the surface of silicon made amorphous by ion-implantation of impurities.

Especially, in semiconductor devices of the 0.18 $\mu$m design rule on, the surfaces of the gate and impurity diffusion layers on the surface of the substrate are silicided by the SALICIDE process. When the surface of a silicon substrate at regions ion-implanted with an n-type impurity As at a high concentration (source region, drain region, etc.) is silicided in the process of production of a semiconductor device, a native oxide film tends to grow before a refractory metal layer is formed on the silicon and becomes a problem. Therefore, the process of production of this case is regarded as a model and the critical conditions of growth of the native oxide film when treating a silicon substrate under the same conditions are examined.

The silicon substrate was treated as follows. First, As was ion-implanted with an ion energy of 60 keV and a dosage of $3 \times 10^{15}$ atoms/cm$^2$. Next, the impurity was diffused by annealing at 800° C. for 30 seconds and another annealing at 1000° C. for 30 seconds. For the purpose of preventing occurrence of lattice defects of silicon crystal due to the annealing, rapid thermal annealing (RTA) was performed twice.

In the actual SALICIDE process, after the silicide is formed, sometimes silicide or defects grow abnormally in the direction of depth of the substrate. To solve this, ion-implantation is again performed and the silicon made amorphous. Therefore, after the above annealing, As was again ion-implanted with an ion energy of 60 keV and a dosage of $3 \times 10^{14}$ atoms/cm$^2$.

After this, the wafer was washed with hydrofluoric acid and the washed wafer was transferred into the carrier container described as the above first embodiment in a nitrogen atmosphere. The concentration of oxygen and the concentration of moisture were made constant at the various conditions shown in Table 1 and after a week, the thicknesses of native oxide films were measured by X-ray photoelectronic spectroscopy (XPS) (measurement limit 0.1 nm). The results were summarized in Table 1. The experiments were performed at 20° C.

TABLE 1

Thickness (nm) of Native oxide film After One Week in Sealed Container

| Concentration of oxygen (ppm) | Concentration of moisture (ppm) | | | |
|---|---|---|---|---|
| | 10 | $10^2$ | $10^3$ | $10^4$ |
| 10 | 0.3 | 0.3 | 0.3 | 0.4 |
| $10^2$ | 0.3 | 0.3 | 1.0 | 1.0 |
| $10^3$ | 0.3 | 1.0 | 1.0 | 1.0 |
| $2.1 \times 10^5$ | 0.4 | 1.0 | 1.0 | 1.0 |

As shown in Table 1, in the cases of (A) where the concentration of oxygen in the nitrogen atmosphere is 10 ppm or less and the concentration of moisture is $10^4$ ppm or less, (B) the concentration of oxygen is $2.1 \times 10^5$ ppm or less and the concentration of moisture is 10 ppm or less, and (C) the concentration of oxygen is $10^2$ ppm or less and the concentration of moisture is $10^2$ ppm or less, it was possible to control the growth of the native oxide film to within 0.4 nm after a week.

Therefore, the product of the concentration of oxygen and the time of each condition is regarded as an approximate value and made a threshold of the integral of the concentration of oxygen. Also, the product of the corresponding concentration of moisture and the time is regarded as an approximate value and made a threshold of the integral of the concentration of moisture. Specifically, the threshold $S(O_2)$ of the integral of the concentration of oxygen and the threshold $S(H_2O)$ of the integral of the concentration of moisture are calculated by the following equations:

$$S(O_2) = (C_O \cdot 10^{-6} \cdot d_O \cdot t)/M_O \quad (1)$$

$$S(H_2O) = (C_H \cdot 10^{-6} \cdot d_H \cdot t)/M_H \quad (2)$$

$S(O_2)$ and $S(H_2O)$ are expressed in units of, for example, [(mol/L)·sec]. Here, $C_O$ is the concentration of oxygen [ppm], $C_H$ is the concentration of moisture [ppm], $d_O$ is the density of oxygen at 20° C. [g/L], $d_H$ is the density of saturated moisture vapor at 20° C. [g/L], t is the elapsed time [sec], $M_O$ is the molecular weight of oxygen, and $M_H$ is the molecular weight of moisture.

The method of storage or the method of conveyance of an electronic part of the present invention is applied to a step at which the native oxide film is formed very thinly and it becomes possible to inhibit the growth of the native oxide film effectively by the above approximation. Electronic parts stored over the above threshold are again treated by, for example, washing or other treatment and subjected to the next step after the native oxide film is removed. Therefore, the yield of products using the electronic parts can be improved.

(Third Embodiment)

Below, an embodiment of the storage apparatus and the method of storage of an electronic part using the apparatus will be explained with reference to the schematic views of FIG. 3 and FIG. 4. The present embodiment shows the storage apparatus and the method of storage of an electronic part using the apparatus preventing a wafer or other electronic part from being contaminated by deposition of boron, phosphorus, and other impurities, organic material and other molecules or particles and thereby able to store an electronic part for a long time.

Figure 3:
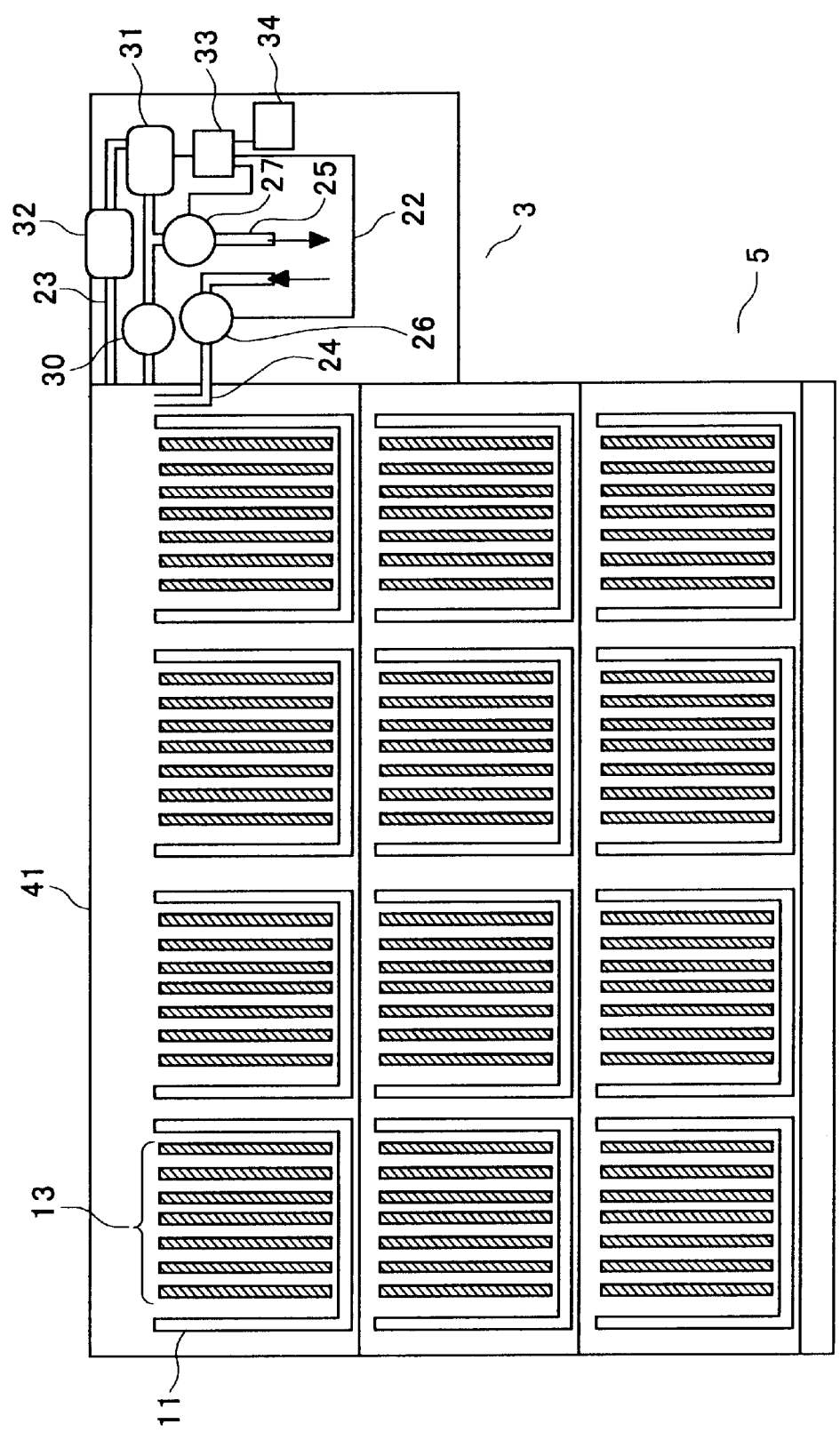
FIG. 3 is a schematic view of the method of storage of an electronic part shown in a third embodiment of the present invention.

As shown in FIG. 3, the storage apparatus 5 of the present embodiment comprises a nitrogen purging stocker 41 able to store a plurality of cassettes 11 and an atmosphere control unit 3 for replacing or controlling an atmosphere in the stocker 41. The cassette 11 holds a plurality of wafers 13. The cassette 11 can be used as the cassette 11 in the apparatus of the first embodiment. Therefore, it is possible to convey a wafer 13 treated by, for example, the washing device 4 of the first embodiment using the conveyable sealed container 1 of the first embodiment and then to store the cassette 11 in the stocker 41 of the present embodiment with the wafers 13 stored in the cassette 11.

The atmosphere control unit 3 used for the sealed stocker of the present embodiment comprises at least a nitrogen introduction pipe 24 for supplying nitrogen gas in the nitrogen purging stocker 41, a nitrogen supply valve 26 for controlling the introduction of nitrogen, a nitrogen exhaust pipe 25 connected to the concentration measurement pipe 23 and exhausting air in the stocker 41, a nitrogen exhaust valve 27 placed between the concentration measurement pipe 23 and the nitrogen exhaust pipe 25, and a supply and exhaust valve control line 22 controlling of operation of the nitrogen supply valve 26 and the nitrogen exhaust valve 27 respectively. Also, the nitrogen to be supplied is made high purity nitrogen purified by filtering.

The gas in the stocker 41 is sent to the oxygen concentration meter 31 and the moisture concentration meter 32 by a circulation pump 30 through the concentration measurement pipe 23. Due to this, the atmosphere in the stocker 41 is monitored at all times.

As the oxygen concentration meter 31, in the same manner as the first embodiment, for example, a zirconia type oxygen concentration meter (Osaka Sanso K.K., OXYMAC series) having a response rate of 10 seconds or better and a sensitivity of 1 ppm or better can be used. As the moisture concentration meter 32, for example, an electrostatic capacity type dew-point hygrometer (Osaka Sanso K.K., DPO-2 type) having a response rate of 10 seconds or better and a sensitivity of 1 ppm or better can be used. It is preferable that both the oxygen concentration meter 31 and the moisture concentration meter 32 be panel mounted type and small and that the volume of the concentration measurement pipe 23 be made small.

Also, a clock 33 is provided in the nitrogen purging stocker 41. The storage of a wafer 13 is started under a condition where the concentration of oxygen and the concentration of moisture are made a predetermined value or less. The elapsed time after that is measured by the clock 33. Nitrogen is continuously supplied in the purging stocker 41 at a predetermined flow rate. The concentration of oxygen and the concentration of moisture in the nitrogen atmosphere are kept at a constant level. An integral of the concentration of oxygen with respect to time (an integral of the concentration of oxygen) and an integral of the concentration of moisture with respect to time (an integral of the concentration of moisture) are calculated at the clock 33 at all times.

A test is conducted in advance to find the integral of the concentration of oxygen and the integral of the concentration of moisture until a native oxide film of a problematic thickness grows and, based on this, thresholds of the integral of the concentration of oxygen and the integral of the concentration of moisture are established. When at least one of the above integral of the concentration of oxygen and the integral of the concentration of moisture has exceeded the threshold, an alarm device 34 or other alarm means warns of that. In this case, the stored electronic part is treated by, for example, washing or other treatment and the native oxide film is removed. Due to this, it becomes easy to inhibit growth of a native oxide film of a problematic thickness on the electronic part and to keep an electronic part in a usable condition. Also, since the growth of the native oxide film is inhibited, the yield of the products using the electronic part can be improved.

Also, the sealed stocker of the present embodiment can be an open stocker in which each cassette 11 is sealed individually and nitrogen is supplied into each cassette 11. In this case, a container storing a cassette 11 with sealing can be the carrier container as shown in the first embodiment.

Figure 4:
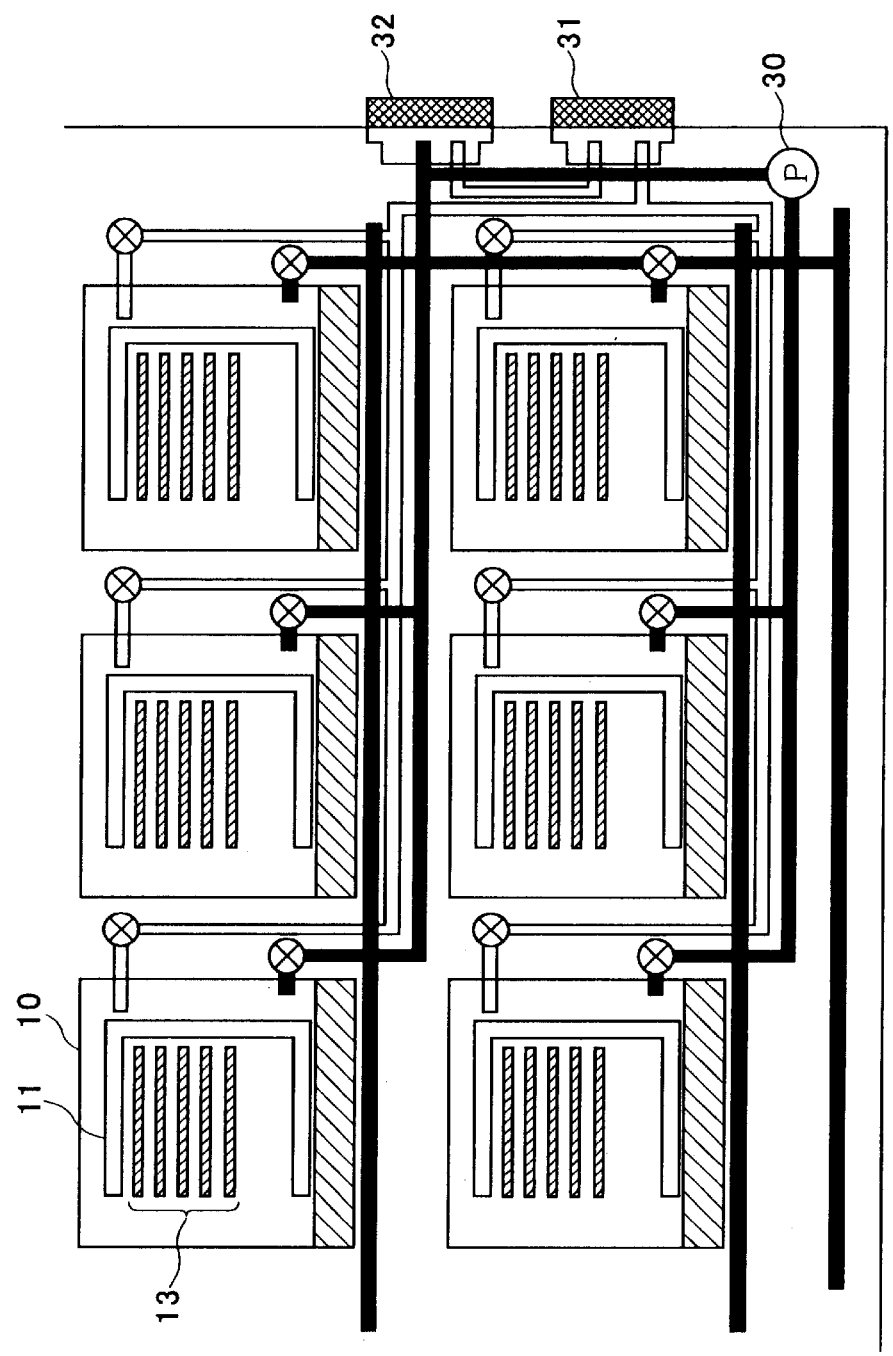
FIG. 4 is a schematic view of the method of storage of an electronic part shown in a third embodiment of the present invention.

FIG. 4 shows an example of an apparatus comprising an open stocker in which the cassette 11 is stored in a carrier container (the container body 10) of the first embodiment and a panel mounted type oxygen concentration meter 31 and a moisture concentration meter 32.

According to the above sealed stockers of the embodiment shown in FIG. 3 and FIG. 4, at the time of storage of an electronic part, it is also possible to stop the supply of the inert gas or decrease the flow rate of the inert gas conditional on the growth of the native oxide film not being accelerated and possible to decrease the cost of the inert gas.

According to the above sealed container, the storage apparatus, the conveyance system of an electronic part, and the method of storage and conveyance of an electronic part of the present invention, it becomes possible to inhibit growth of the native oxide film on an electronic part without an excessive supply of nitrogen.

The embodiments of the sealed container, the storage apparatus, the conveyance system of an electronic part, and the method of storage and conveyance of an electronic part of the present invention are not limited to the above explanation. For example, as an electronic part, a metal part of a magnetic head and a disk etc. can be mentioned other than the silicon substrate. It is also possible to apply the present invention to an electronic part other than a silicon substrate. In addition, various modifications may be made within a range not outside the gist of the present invention.

Summarizing the effect of the invention, as explained above, according to the sealed container, the storage apparatus, and the electronic part conveyance system of the present invention, it is possible to inhibit formation of a native oxide film on a surface of a wafer, a substrate or other electronic part without an excessive supply of an inert gas.

According to the method of storage and conveyance of an electronic part of the present invention, it is possible to inhibit formation of the native oxide film on the surface of a wafer, a substrate or other electronic part without an excessive supply of an inert gas. Therefore, it becomes possible to decrease the production cost and improve the yield of products using the electronic part.

While the invention has been described with reference to specific embodiment chosen for purpose of illustration, it should be apparent that numerous modifications could be made thereto by those skilled in the art without departing from the basic concept and scope of the invention.

What is claimed is:

1. A sealed container for storing an electronic part in an inert gas atmosphere, said sealed container comprising:
    an oxygen concentration meter for measuring a concentration of oxygen in a sealed space filled with the inert gas;
    a moisture concentration meter for measuring a concentration of moisture in the sealed space;
    a time counting means for counting an elapsed time from when storing the electronic part in the sealed space;
    a judging means for comparing the elapsed time with a predetermined reference time and judging its magnitude with the reference time; and
    an alarm means for warning that the elapsed time has exceeded the reference time.

2. A sealed container as set forth in claim 1, wherein the reference time is a time until a predetermined thickness of a native oxide film affecting a characteristic of the electronic part is formed on the surface of the electronic part.

3. A sealed container for storing an electronic part in an inert gas atmosphere, said sealed container comprising:
    an oxygen concentration meter for measuring a concentration of oxygen in a sealed space filled with the inert gas;
    a moisture concentration meter for measuring a concentration of moisture in the sealed space;
    a time counting means for counting an elapsed time from when storing the electronic part in the sealed space;
    a calculating means for calculating an integral of the concentration of oxygen obtained by integrating the concentration of oxygen with respect to the elapsed time and an integral of the concentration of moisture obtained by integrating the concentration of moisture with respect to the elapsed time;
    a first judging means for comparing the integral of the concentration of oxygen with a predetermined oxygen reference value and judging its magnitude compared with the oxygen reference value;
    a second judging means for comparing the integral of the concentration of moisture with a predetermined moisture reference value and judging its magnitude compared with the moisture reference value; and
    an alarm means for warning that at least one of the integral of the concentration of oxygen and the integral of the concentration of moisture has exceeded a reference value.

4. A sealed container as set forth in claim 3, wherein the reference value is an integral of the concentration of oxygen with respect to time or an integral of the concentration of moisture with respect to time until a predetermined thickness of a native oxide film affecting a characteristic of the electronic part is formed on the surface of the electronic part.

5. A sealed container as set forth in claim 4, wherein the inert gas atmosphere is a nitrogen gas atmosphere.

6. A sealed container as set forth in claim 4, wherein the electronic part comprises a silicon substrate.

7. A sealed container as set forth in claim 6, wherein the predetermined thickness is about 0.3 nm.

8. A storage apparatus storing at least one electronic part in a storage unit with an inert gas atmosphere, said storage apparatus comprising:
    an atmosphere replacement device for replacing the gas in the storage unit with the inert gas;

an oxygen concentration meter for measuring a concentration of oxygen in the storage unit filled with the inert gas;

a moisture concentration meter for measuring a concentration of moisture in the storage unit;

a time counting means for counting an elapsed time from when storing the electronic part in the storage unit;

a calculating means for calculating an integral of the concentration of oxygen obtained by integrating the concentration of oxygen with respect to the elapsed time and an integral of the concentration of moisture obtained by integrating the concentration of moisture with respect to the elapsed time;

a first judging means for comparing the integral of the concentration of oxygen with a predetermined oxygen reference value and judging its magnitude compared with the oxygen reference value;

a second judging means for comparing the integral of the concentration of moisture with a predetermined moisture reference value and judging its magnitude compared with the moisture reference value; and an alarm means for warning that at least one of the integral of the concentration of oxygen and the integral of the concentration of moisture has exceeded a reference value.

9. A storage apparatus as set forth in claim 8, wherein the reference value is an integral of the concentration of oxygen with respect to time or an integral of the concentration of moisture with respect to time until a predetermined thickness of a native oxide film affecting a characteristic of the electronic part is formed on the surface of the electronic part.

10. A storage apparatus as set forth in claim 9, wherein the inert gas atmosphere is a nitrogen gas atmosphere.

11. A storage apparatus as set forth in claim 9, wherein the electronic part comprises a silicon substrate.

12. A storage apparatus as set forth in claim 11, wherein the predetermined thickness is about 0.3 nm.

13. An electronic part conveyance system comprising:

a sealed container for storing and conveying an electronic part in an inert gas atmosphere, comprising an opening for loading and unloading of the electronic part and a cover for covering the opening and holding the electronic part;

a treatment device attachable with and detachable from the sealed container, tightly contacting the cover and the periphery of the opening of the sealed container, and treating the electronic part in the inside filled with the inert gas;

a support connected with the cover;

a support moving means built in the treatment device for moving the support, the cover, and the electronic part in the treatment device:

a gas replacement device for supplying an inert gas into a shared sealed space formed in the sealed container and the treatment device in a state with the support, the cover and the electronic part moved inside the treatment device;

said device replacing the gas in the shared sealed space;

an oxygen concentration meter for measuring a concentration of oxygen in the shared sealed space filled with the inert gas;

a moisture concentration meter for measuring a concentration of moisture in the shared sealed space;

a time counting means for counting an elapsed time from when treatment of the electronic part in the treatment device is finished;

a calculating means for calculating an integral of the concentration of oxygen obtained by integrating the concentration of oxygen with respect to the elapsed time and an integral of the concentration of moisture obtained by integrating the concentration of moisture with respect to the elapsed time;

a first judging means for comparing the integral of the concentration of oxygen with a predetermined oxygen reference value and judging its magnitude compared with the oxygen reference value;

a second judging means for comparing the integral of the concentration of moisture with a predetermined moisture reference value and judging its magnitude compared with the moisture reference value; and an alarm means for warning that at least one of the integral of the concentration of oxygen and the integral of the concentration of moisture has exceeded a reference value.

14. An electronic part conveyance system as set forth in claim 13, wherein the reference value is an integral of the concentration of oxygen with respect to time or an integral of the concentration of moisture with respect to time until a predetermined thickness of a native oxide film affecting a characteristic of the electronic part is formed on the surface of the electronic part.

15. An electronic part conveyance system as set forth in claim 14, wherein the electronic part comprises a silicon substrate.

16. An electronic part conveyance system as set forth in claim 15, wherein the predetermined thickness is about 0.3 nm.

17. An electronic part conveyance system as set forth in claim 14, wherein the inert gas atmosphere is a nitrogen gas atmosphere.

18. An electronic part conveyance system as set forth in claim 13, wherein the treatment comprises a washing treatment and the treatment device comprises a washing device.

19. A method of storage of an electronic part comprising the steps of:

storing the electronic part in a sealed container filled with an inert gas;

measuring a concentration of oxygen and a concentration of moisture in the sealed container;

counting an elapsed time from when storing the electronic part in the sealed container;

calculating an integral of the concentration of oxygen obtained by integrating the concentration of oxygen with respect to the elapsed time and an integral of the concentration of moisture obtained by integrating the concentration of moisture with respect to the elapsed time;

comparing the integral of the concentration of oxygen with a predetermined oxygen reference value and judging its magnitude compared with the oxygen reference value;

comparing the integral of the concentration of moisture with a predetermined moisture reference value and judging its magnitude compared with the moisture reference value; and warning that at least one of the integral of the concentration of oxygen and the integral of the concentration of moisture has exceeded a reference value.

20. A method of storage of an electronic part as set forth in claim 19, further comprising the step of determining that the electronic part is unable to be used if the integral of the concentration of oxygen has exceeded the oxygen reference value and/or if the integral of the concentration of moisture has exceeded the moisture reference value.

21. A method of storage of an electronic part as set forth in claim 19, further comprising the step of conducting a test in advance to find the integral of the concentration of oxygen with respect to time and the integral of the concentration of moisture with respect to time until a predetermined thickness of a native oxide film affecting a characteristic of the electronic part is formed on the surface of the electronic part and using the integrals as the reference values.

22. A method of storage of an electronic part as set forth in claim 21, wherein the test is conducted under the condition of supply of an inert gas and the concentration of oxygen and the concentration of moisture being kept constant.

23. A method of storage of an electronic part as set forth in claim 21, wherein:
the inert gas is a nitrogen gas;
the electronic part comprises a silicon substrate;
the oxygen reference value is an integral of the concentration of oxygen of about 10 ppm with respect to at least one week;
the moisture reference value is an integral of the concentration of moisture of about $10^4$ ppm with respect to at least one week; and
the predetermined thickness is about 0.3 nm.

24. A method of storage of an electronic part as set forth in claim 21, wherein:
the inert gas is a nitrogen gas;
the electronic part comprises a silicon substrate;
the oxygen reference value is an integral of the concentration of oxygen of about $2.1 \times 10^5$ ppm with respect to at least one week;
the moisture reference value is an integral of the concentration of moisture of about 10 ppm with respect to at least one week; and
the predetermined thickness is about 0.3 nm.

25. A method of storage of an electronic part as set forth in claim 21, wherein:
the inert gas is a nitrogen gas;
the electronic part comprises a silicon substrate;
the oxygen reference value is an integral of the concentration of oxygen of about $10^2$ ppm with respect to at least one week;
the moisture reference value is an integral of the concentration of moisture of about $10^2$ ppm with respect to at least one week; and
the predetermined thickness is about 0.3 nm.

26. A method of storage of an electronic part as set forth in claim 19, wherein the inert gas is a nitrogen gas.

27. A method of storage of an electronic part as set forth in claim 19, wherein the electronic part comprises a silicon substrate.

28. A method of storage of an electronic part comprising the steps of:
storing at least one electronic part in a storage apparatus filled with an inert gas;
supplying the inert gas in the storage apparatus;
measuring a concentration of oxygen and a concentration of moisture in the storage apparatus;
counting an elapsed time from when storing the electronic part in the storage apparatus;
calculating an integral of the concentration of oxygen obtained by integrating the concentration of oxygen with respect to the elapsed time and an integral of the concentration of moisture obtained by integrating the concentration of moisture with respect to the elapsed time;
comparing the integral of the concentration of oxygen with a predetermined oxygen reference value and judging its magnitude compared with the oxygen reference value;
comparing the integral of the concentration of moisture with a predetermined moisture reference value and judging its magnitude compared with the moisture reference value; and
warning that at least one of the integral of the concentration of oxygen and the integral of the concentration of moisture has exceeded the threshold.

29. A method of storage of an electronic part as set forth in claim 28, further comprising the step of determining that the electronic part is unable to be used if the integral of the concentration of oxygen has exceeded the oxygen reference value and/or if the integral of the concentration of moisture has exceeded the moisture reference value.

30. A method of storage of an electronic part as set forth in claim 28, further comprising the step of conducting a test in advance to find the integral of the concentration of oxygen with respect to time and the integral of the concentration of moisture with respect to time until a predetermined thickness of a native oxide film affecting a characteristic of the electronic part is formed on the surface of the electronic part and using the integrals as the reference values.

31. A method of conveyance of an electronic part for moving an electronic part between a sealed container and a treatment device; said sealed container comprising an opening for loading and unloading of the electronic part and a cover for covering the opening and holding the electronic part and storing and conveying the electronic part in an inert gas atmosphere, and said treatment device attachable with and detachable from the sealed container and treating the electronic part in the inside filled with the inert gas;
said method comprising the steps of:
bringing the cover and the periphery of the opening of the sealed container into tight contact with a support of a surface of the treatment device;
making the support, the cover, and the electronic part move in the treatment device to form a shared sealed space in the sealed container and the treatment device;
treating the electronic part;
supplying the inert gas in the shared sealed space;
measuring a concentration of oxygen and a concentration of moisture in the sealed container;
counting an elapsed time from when the treatment is finished;
calculating an integral of the concentration of oxygen obtained by integrating the concentration of oxygen with respect to the elapsed time and an integral of the concentration of moisture obtained by integrating the concentration of moisture with respect to the elapsed time;
comparing the integral of the concentration of oxygen with a predetermined oxygen reference value and judging its magnitude compared with the oxygen reference value;
comparing the integral of the concentration of moisture with a predetermined moisture reference value and judging its magnitude compared with the moisture reference value;
warning that at least one of the integral of the concentration of oxygen and the integral of the concentration of moisture has exceeded a reference value; and, before any such warning, making the support move until the cover covers the opening and thereby storing the electronic part in the sealed container.

32. A method of conveyance of an electronic part as set forth in claim 31, further comprising the step of conducting a test in advance to find the integral of the concentration of oxygen with respect to time and the integral of the concentration of moisture with respect to time until a predetermined thickness of a native oxide film affecting a characteristic of the electronic part is formed on the surface of the electronic part and using the integrals as the reference values.

33. A method of conveyance of an electronic part as set forth in claim 31, wherein the treatment comprises a washing treatment and the treatment device comprises a washing device.

34. A method of conveyance of an electronic part as set forth in claim 31, wherein the inert gas atmosphere is a nitrogen gas atmosphere.

35. A method of conveyance of an electronic part as set forth in claim 31, wherein the electronic part comprises a silicon substrate.

* * * * *